(12) United States Patent
Beele

(10) Patent No.: US 6,777,616 B2
(45) Date of Patent: Aug. 17, 2004

(54) BUSHING ARRANGEMENT

(75) Inventor: Johannes Alfred Beele, Aalten (NL)

(73) Assignee: Beele Engineering B.V., Aalten (NL)

( * ) Notice: Subject to any disclaimer, the term of this patent is extended or adjusted under 35 U.S.C. 154(b) by 0 days.

(21) Appl. No.: 10/359,802

(22) Filed: Feb. 6, 2003

(65) Prior Publication Data

US 2003/0201114 A1 Oct. 30, 2003

Related U.S. Application Data

(63) Continuation of application No. PCT/NL01/00594, filed on Aug. 8, 2001.

(30) Foreign Application Priority Data

Aug. 8, 2000 (NL) .............................. 1015895

(51) Int. Cl.[7] .................................. H02G 3/18
(52) U.S. Cl. .................. 174/65 R; 174/78; 174/140 R; 174/152 R; 252/511; 439/98
(58) Field of Search ................................ 174/65 R, 78, 174/117 A, 152 R, 140 R; 439/98, 110; 252/511, 512; 250/519.1

(56) References Cited

U.S. PATENT DOCUMENTS 5,463,186 A * 10/1995 Schricker ..................... 174/36

2002/0121390 A1 * 9/2002 Alznauer et al. ....... 174/152 R

FOREIGN PATENT DOCUMENTS

| FR | 2657471 | 1/1990 |
|----|---------|--------|
| FR | 2657471 | 7/1991 |
| GB | 2265262 | 9/1993 |
| WO | WO 9945620 | 9/1999 |
| WO | WO 0023513 | 4/2000 |

* cited by examiner

*Primary Examiner*—Dhiru R Patel
(74) *Attorney, Agent, or Firm*—Jones Day

(57) ABSTRACT

A bushing arrangement and method for passing an electrical cable with conductive shielding through an opening in a wall while providing protection against electromagnetic overtension and electrical interference and the like, including the placement of an electrically conductive bushing in the wall opening that is electrically connected to earth ground potential, and electrically connecting an electrically conductive tape between the electrically conducting shielding and the electrically conductive bushing so as to connect the conductive shielding to earth ground potential. The electrically conductive tape is made electrically conductive by the use of carbon black particles.

17 Claims, 4 Drawing Sheets

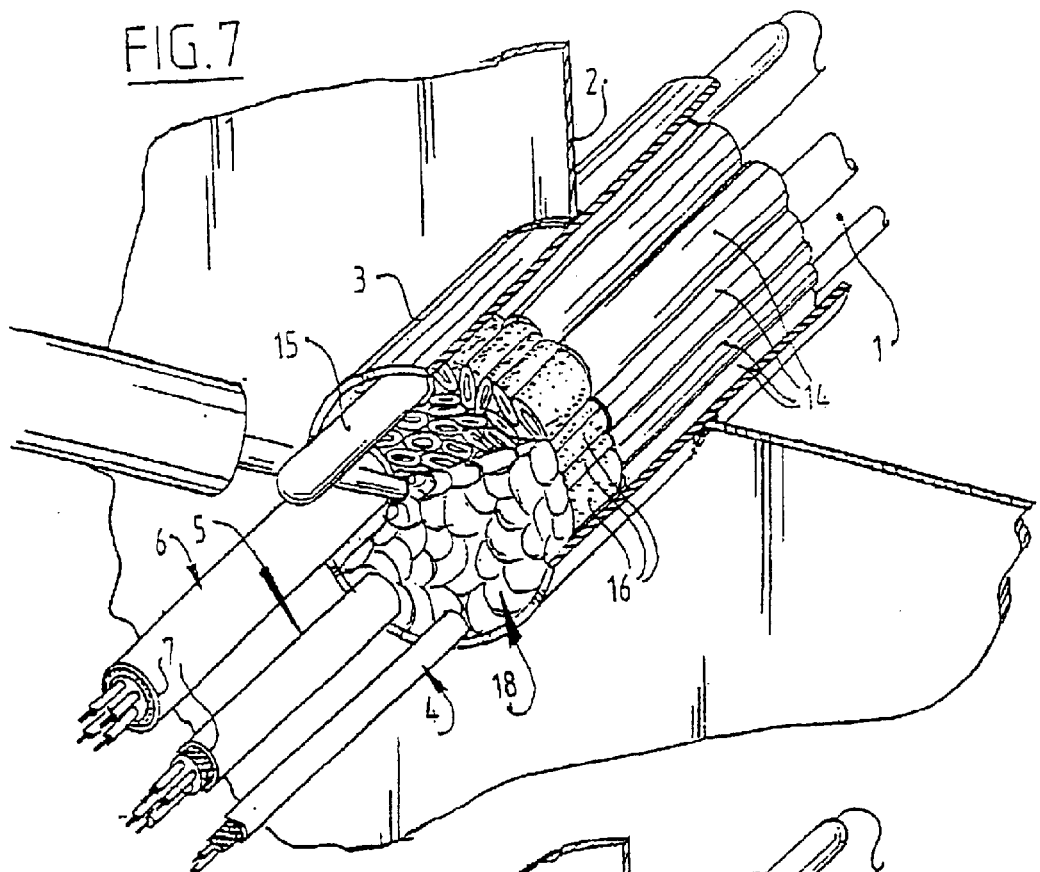
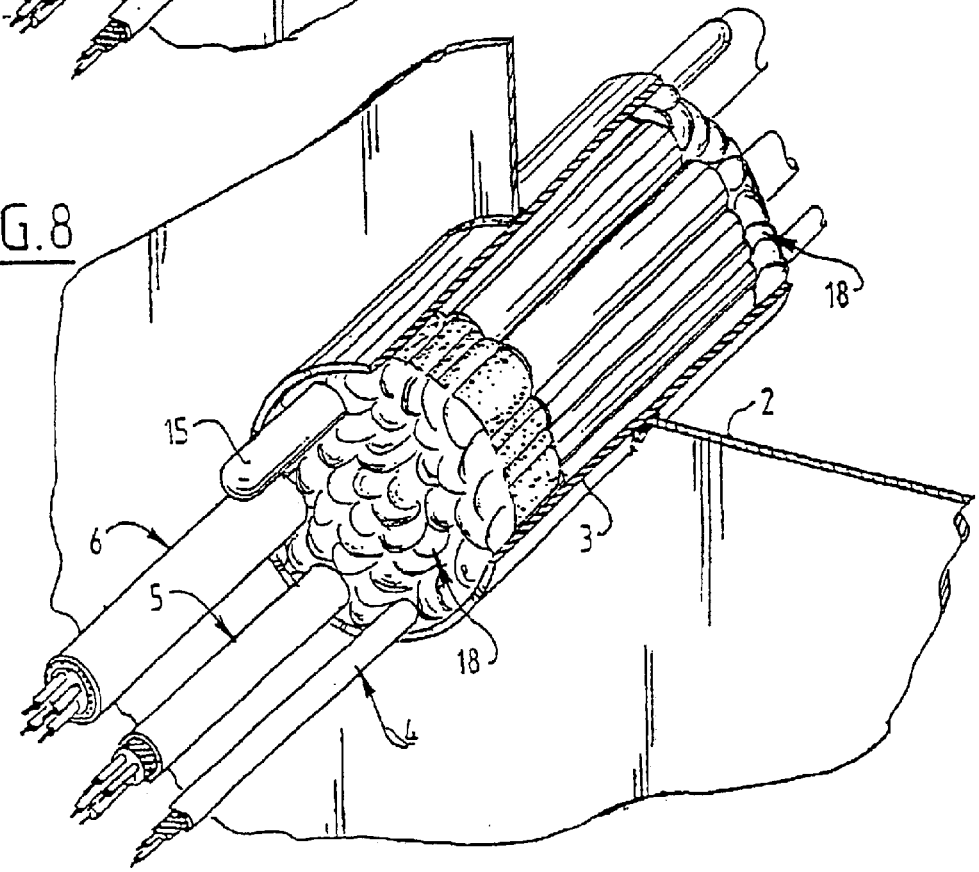

BUSHING ARRANGEMENT

CROSS REFERENCE TO RELATED APPLICATIONS

This application is a continuation of International Application No. PCT/NL01/00594, filed Aug. 8, 2001, which claims the benefit of Netherlands Patent Application No. 1015895, filed Aug. 8, 2000.

STATEMENT REGARDING FEDERALLY SPONSORED RESEARCH

Not applicable.

REFERENCE TO A "SEQUENCE LISTING"

Not Applicable.

BACKGROUND OF THE INVENTION

1. Field of the Invention

The invention relates to a bushing arrangement and method for passing cable through an opening in a wall, plating, partition and the like, such as a bulkhead of a ship, for example while providing protection against electromagnetic overtension and/or interference. Hereinafter, the term "wall" will be used for the sake of simplicity, while this term is understood to include other partitions as well.

2. Description of the Related Art

A bushing arrangement is disclosed in Dutch patent application no. 1011718 in the name of the present applicant. The bushing arrangement that is disclosed therein consists of a steel bushing fitted in a wall opening, through which a number of single-core or multiple-core steel bushing fitted in a wall opening, through which a number of single-core or multiple-core cables are passed. The cables are stripped of their sheathing along a suitable part of their length, so that said cables can locally come into electrically conductive contact with their environment. The longitudinal parts of the cables are then embedded in an electrically conductive moulding paste so as to effect electrical conduction between the cables and the bushing arrangement, after which the wall opening is filled up with a suitable sealing compound. A rubber hose member may be fitted round each cable before the moulding paste is provided, while any remaining space in the wall opening will be filled with the similar hose members. One drawback of the bushing arrangement that is disclosed in the aforesaid Dutch patent application is the fact that it has become apparent in practice that in some cases the moulding paste exhibits a relatively high electrical resistance value, in the order of about 100–100 Ohm, after curing. In particular this means that the degree to which electricity can flow away to earth or ground via the moulding paste has decreased considerably, which has an adverse effect on the extent of protection that is provided against electromagnetic overtension. The same applies, mutatis mutandis, as regards (the protection against) electromagnetic interference.

BRIEF SUMMARY OF THE INVENTION

The object of the invention is to improve the bushing arrangement that is known from the prior art, in the sense that there is proposed a high-grade fire resistant, gastight and liquid-tight bushing arrangement which is furthermore optimally protected against electromagnetic overtension and/or interference.

In order to accomplish that objective, a bushing arrangement of the kind referred to in the introduction is characterized in that the bushing arrangement includes an electrically conductive tape which is in contact with an electrically conductive cable shielding of a one cable being passed through and which functions to earth the cable shielding.

Electrical installations and machines, which usually include highly sensitive components, for example for control and registration purposes, can easily experience interference caused by various external electromagnetic (em) fields and pulses. Such electromagnetic fields and pulses may have been generated by radar installations, thunderstorms, nuclear explosions and electrical equipment, for example. A measure that is frequently used in practice for reducing such interference is the provision of a steel structure which functions as a Faraday cage around the space that is intended for electronic equipment. Electrical cables that are passed into such a screened space can conduct undesirable electromagnetic fields and pulses into the electronic equipment, however. Such conduction will generally take place over the electrically conductive shielding (braid) of the respective cables that are passed through.

According to the invention, the external undesirable em fields and pulses will flow away to earth along the electrically conductive shielding of a cable being passed through, via the electrically conductive tape. In particular, the electrically conductive tape is at least partially wound round the electrically conductive cable shielding.

It is noted that within the framework of the invention the term "cable" is understood to include an electrically conductive conduit, tube, pipe or the like, for example a metallic tube or pipe, with the present tape being in electrically conductive contact therewith when operative.

In one preferred embodiment of a bushing arrangement according to the invention, the electrically conductive tape is wound around the electrically conductive cable shielding near one end, while it is in electrically conductive contact with an electrically conductive bushing housing (made of a metal, for example) that is fitted in the opening in the wall. In another preferred embodiment, the grounding of the electrically conductive cable shielding is effected by means of the electrically conductive tape by providing an electrically conductive material on at least one open side of the wall, which material is in electrically conductive contact with the tape. The electrically conductive material is at least substantially made up of several pieces of electrically conductive tape material, whether or not folded, which have been placed into the opening, and/or of several electrically conductive sleeves or hose members which have been placed into the opening, which hose members or sleeves preferably extend in the same direction as the cable being passed through.

In another preferred variant, the electrically conductive material is the graphite-containing moulding paste that is known from the aforesaid Dutch patent application no. 1011718.

In another preferred embodiment of a bushing arrangement according to the invention, the electrically conductive tape and/or the electrically conductive sleeve is/are substantially made of an electrically conductive rubber. The rubber has been made electrically conductive by chemical means, in particular through the addition thereto of carbon particles, preferably in the form of carbon black. In particular, the rubber is EPDM rubber, while the carbon particles are preferably concave shell-shaped, especially of the type "Ketjenblack EC" 300J or 600 JD™. These existing types of carbon black known under the commercial name of "Ketjenblack" have a unique morphology in comparison with conventional types of carbon black, which renders them exceptionally suitable for the present electrically conductive application. The abbreviation EPDM stands for Ethylene/Propylene/Diene/Monomer. It is noted that also other elastomers or plastomers can be used as materials for the tape and the sleeves.

In another preferred embodiment of a bushing arrangement according to the invention, the electrically conductive tape is a metal tape. Preferably, the electrically conductive tape, rubber or metal, is flexible, that is, deformable, so that it can readily be passed along other cables that are passed through the bushing arrangement.

In another preferred embodiment of a bushing arrangement according to the invention, the electrically conductive tape has a contact width of at least about 20 mm, preferably about 40 mm. In the latter case, the tape is usually used for civil applications (attenuation factor −30 dB), while a contact width of more than 100 mm (attenuation factor −60 dB) can be used for military applications. By winding the present tape of such width around the electrically conductive cable shielding, an optimum electrically conductive contact is effected so as to prevent electromagnetic overtension and/or interference.

In another preferred embodiment of a bushing arrangement according to the invention, the remaining space in the wall opening is at least partially filled up with several fire resistant sleeves, which extend in the same direction as the cable being passed through. Each cable may be passed through one of the sleeves. The sleeves or hose members are preferably divided lengthways, so that, in the latter case, they can be fitted over the cables after the cables have been pulled through the bushing arrangement.

In another preferred embodiment of a bushing arrangement according to the invention, a heat resistant and/or liquid repellent (preferably expandable) putty is used in at least one open side of the wall opening for sealing the wall opening. The putty functions to enhance the gas tightness and liquid tightness of the present bushing arrangement.

The invention furthermore relates to a method for passing a cable through an opening in a wall while providing protection against electromagnetic overtension and/or interference, using a bushing arrangement according to the invention, characterized in that in use an electrically conductive tape is brought into contact with the electrically conductive shielding of the cable being passed through for the purpose of grounding it.

BRIEF DESCRIPTION OF THE SEVERAL VIEWS OF THE DRAWING

FIG. 7 is an isometric view similar to those shown in FIGS. 1–6 with the addition of putty at one end of the bushing.

FIG. 8 is an isometric view similar to those shown in FIGS. 1–7 and illustrating the application of putty at both ends of the bushing.

DETAILED DESCRIPTION OF A PREFERRED EMBODIMENT OF THE INVENTION

Figure 1:
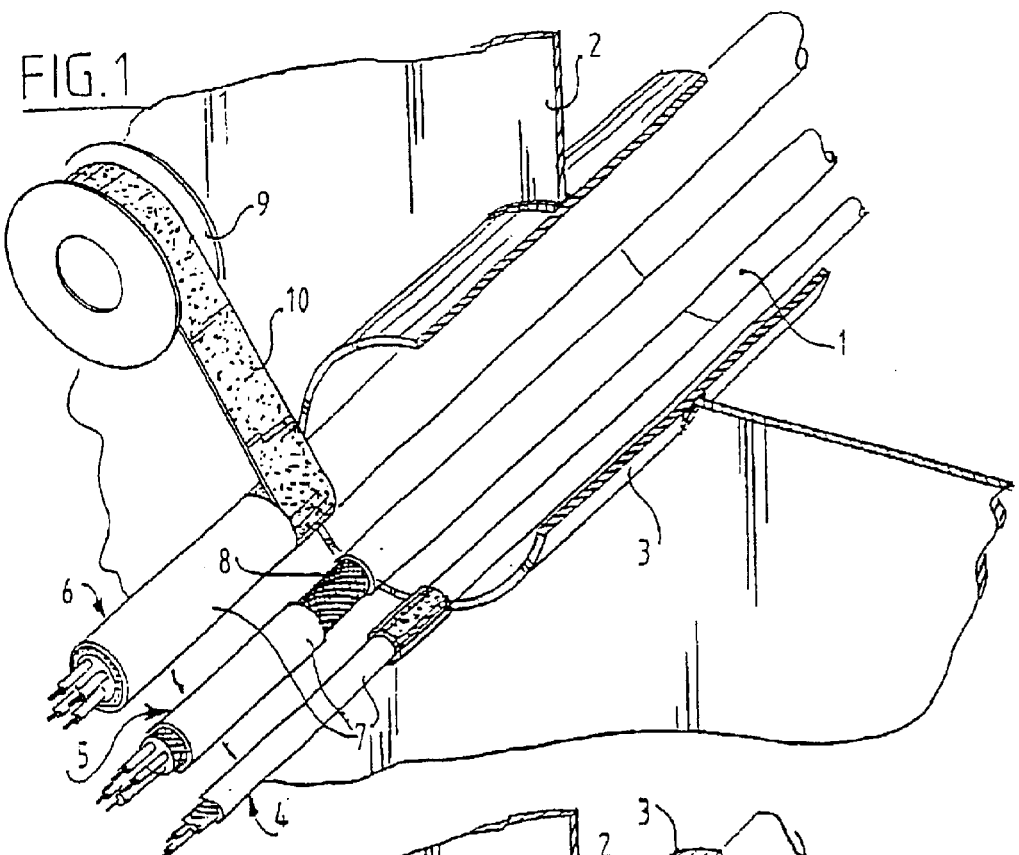
FIG. 1 is an isometric view of a wall, a wall bushing and several electrical cables with exposed shields being taped with electrically conductive tape.

FIG. 1 shows an opening in a wall 2, in which a steel bushing housing 3 is mounted. For the sake of simplicity, only three multi-core cables 4, 5, 6 are shown in the drawing, which cables have each been stripped of their plastic sheathing 7 along part of their length, so that their electrically conductive shielding (braid) 8 is now exposed. In accordance with the invention, a tape 10 of EPDM rubber on a winding roll 9 is used, which tape has been made electrically conductive by the chemical addition thereto of carbon particles, for example carbon black particles having concave, shell-shapes, which tape is to be wound round the electrically conductive cable shielding 8. Tape 10 preferably has a width of 40 mm, so that an optimum electrically conductive contact with the electrically conductive cable shielding 8 is realised. The electrical earthing is ensured by winding tape 10 to a diameter larger than that of cables 4, 5, 6, as is shown in FIG. 1 and as will be explained in more detail yet.

Figure 2:
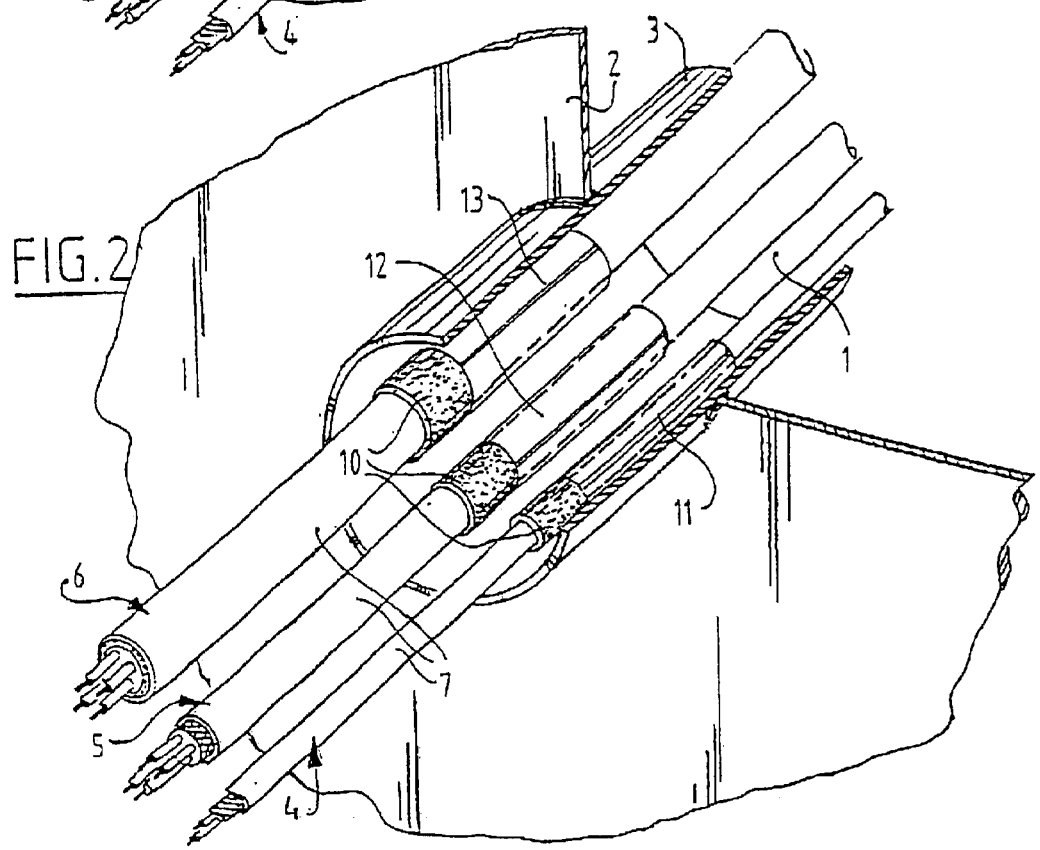
FIG. 2 is an isometric view similar to the view shown in FIG. 1 with fire retardant hoses placed around the electrical cables.
Figure 3:
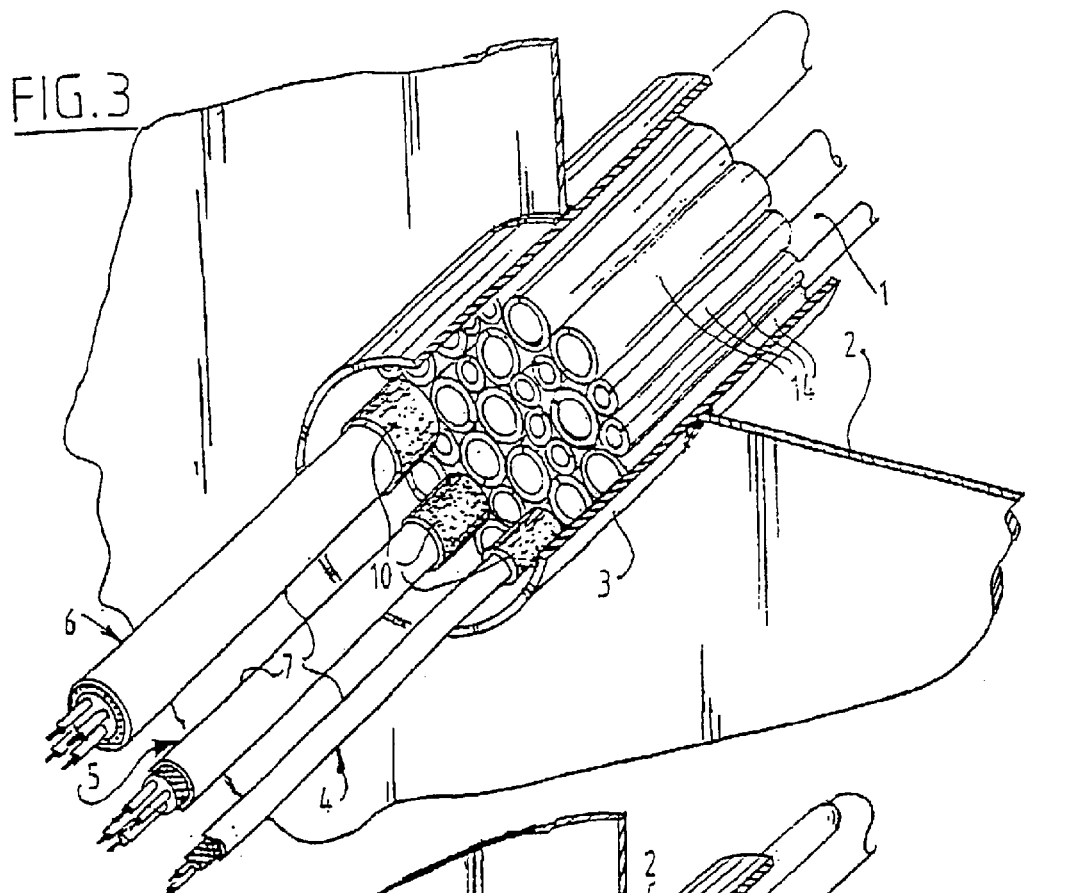
FIG. 3 is an isometric view similar to those shown in FIGS. 1 and 2 with the addition of additional fire resistant hoses.
Figure 4:
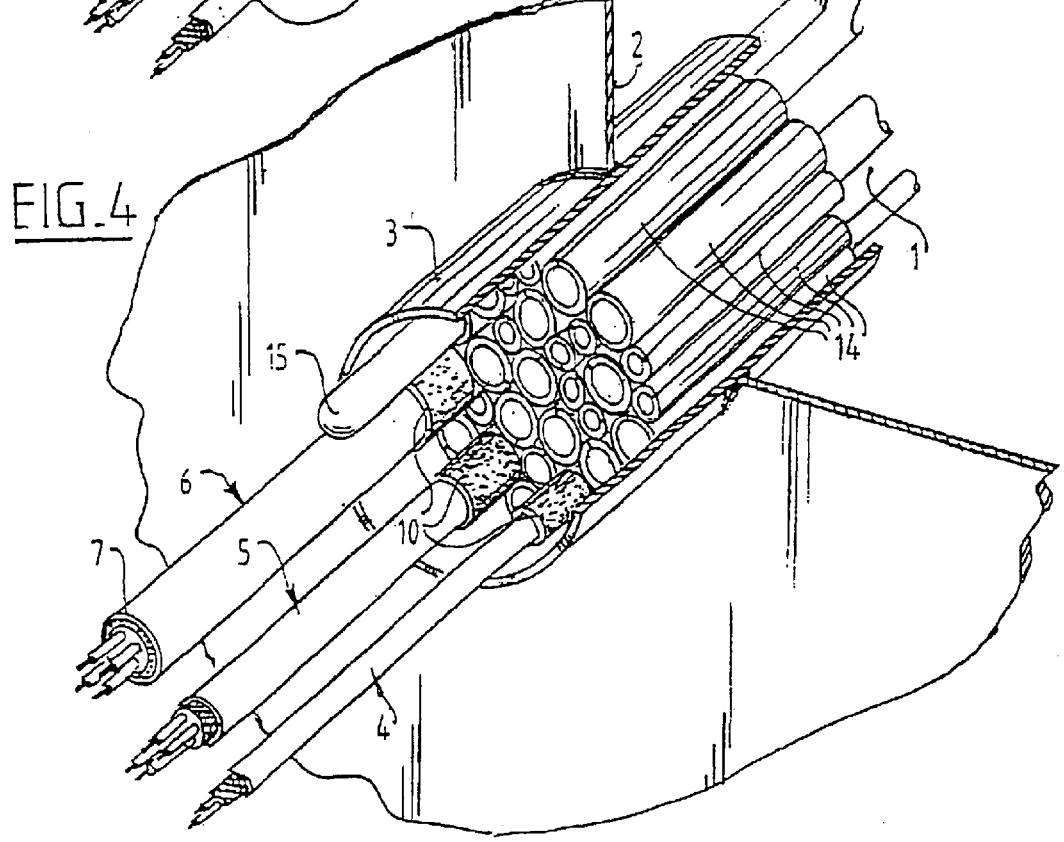
FIG. 4 is an isometric view similar to those shown in FIGS. 1–3 with the addition of a bar shaped element mounted within one of the hoses.

FIG. 2 shows the situation of FIG. 1, with the understanding that a fire resistant (rubber) hose member 11, 12, 13 is fitted round each cable 4, 5, 6 and that the provision of the tape 10 has been concluded by cutting tape 10 off the winding roll 9 and attaching the free end of tape 10 thus formed to the part of the tape 10 that has already been wound round the cable by heating the free end. "Attachment" can also be effected by binding a band or the like round the wound tape 10. In FIG. 3, the remaining space of the bushing housing 3 in the wall opening 1 is filled with fire resistant (rubber) hose members 14, which are identical to hose members 11, 12, 13. Hose members 14 function as fillers, therefore. A bar-shaped element 15 shown in FIG. 4 (which may or may not be made of an electrically conductive material) is inserted in one of the hose members 14 in order to make it possible to pass a new cable through the bushing housing 3 in place of the bar-shaped element in due course. Thus, the bar-shaped element 15 functions to determine the correct position for the new cable. Hose members 11, 12, 13, 14 are known under the trade name "RISE" of the present applicant.

Figure 5:
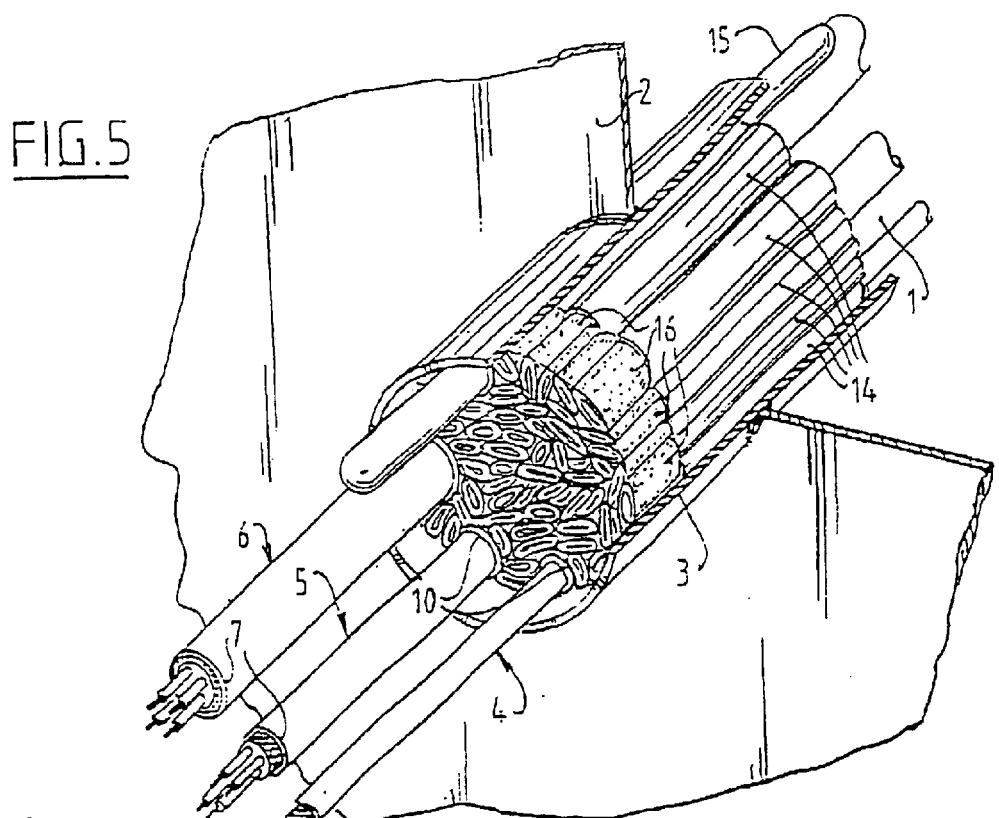
FIG. 5 is an isometric view similar to those shown in FIGS. 1–4 and including electrically conductive hoses packed around the electrical cables.
Figure 6:
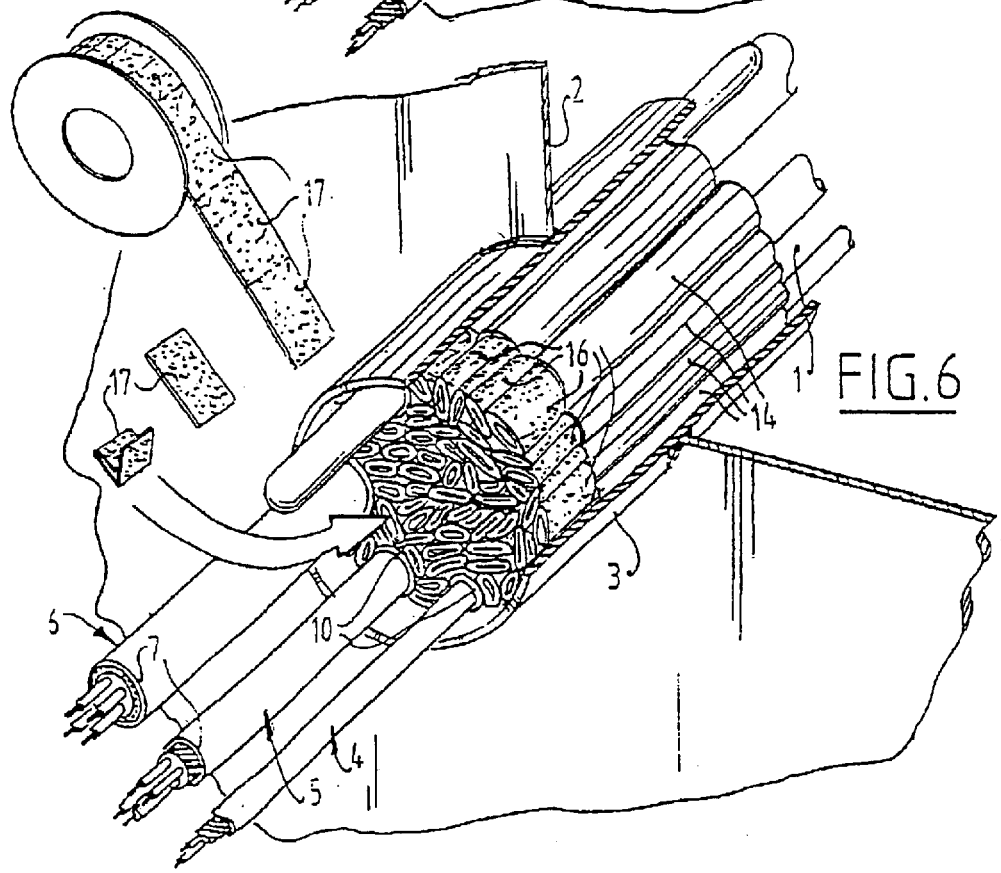
FIG. 6 is an isometric view similar to the views shown in FIGS. 1–5 illustrating electrically conductive tape rather than the electrically conductive hoses of the FIG. 5 view.

In FIG. 5, hose members 16 of an electrically conductive material are disposed on one open side of wall opening 1, while it is also possible to use folded pieces 17 of tape 10 (FIG. 6) in addition to or instead of the hose members. Since the hose members 16 are made of the same electrically conductive material as tape 10, viz. EPDM rubber that has been made electrically conductive by the addition of carbon particles, the electrically conductive cable shielding 8 is in earthed connection with steel bushing housing 3 via tape 10, hose members 16 and/or pieces of tape 17. As already stated, tape 10 is wound to a diameter larger than that of the cable so as to ensure the electrically conductive contact between tape 10 and hose members 16. Finally, a putty 18 (which is known under the trade name "FIWA") of the present applicant is sealingly provided on that side of the wall opening 1 (FIG. 7). It is also possible, of course, to fit the hose members 16 and/or the pieces of tape 17 on either side of the wall opening 1. In particular tape 10 and putty 18 provide an airtight seal of opening 1, thus preventing corrosion of the electrically conductive cable shielding 8. The putty 18, FIG. 8, may be used on both sides of the wall 2 within the housing 3.

The present bushing arrangement is based on the use of two types of hose members, therefore: hose members 11, 12, 13, 14 of a fire resistant (non-vulcanized) rubber on the one hand (with hose members 11, 12, 13 being fitted around cables 4, 5 and 6, respectively, and hose members 14 functioning as fillers), and hose members 16 of an electrically conductive rubber material corresponding to that of tape 10 on the other hand. It is also possible, of course, to form both types of the electrically conductive rubber. In addition, it is possible to use massive hose members 14, 16 of vulcanized rubber instead of or in addition to the hollow hose members 14, 16. Such massive hose members in fact form bar material in that case.

From the figures it will be understood that the terms opening in the wall, wall opening or the like as used herein, when use in conjunction with a bushing arrangement, are understood to mean the opening in the bushing housing, the bushing housing opening and the like.

It is noted that the invention is not restricted to the embodiment as shown in the drawing, but that it also comprises other embodiments that fall within the scope of the appended claims.

What is claimed is:

1. A bushing arrangement for passing at least one electrical cable through an opening in a wall to provide protection against electromagnetic overtension and interference, said bushing arrangement comprising:

an electrically conductive tape substantially made of an electrically conductive rubber by the addition thereto of carbon particles in the form of carbon black; and an electrically conductive cable shielding of said at least one cable being in contact with said electrically conductive tape and functioning to connect said cable shielding to earth ground.

2. The bushing arrangement according to claim 1, wherein said electrically conductive tape is at least partially wound around the electrically conductive cable shielding.

3. The bushing arrangement according to claim 2, comprising:

an electrically conductive bushing housing fitted in the opening in said wall; and said electrically conductive tape being wound around the electrically conductive cable shielding to provide electrical contact between said cable shielding and said electrically conductive bushing housing to electrically couple said cable shielding to earth ground.

4. The bushing arrangement according to claim 1, including electrically conductive material provided on at least one side of said wall opening, said electrically conductive material being in electrically conductive contact with said tape.

5. The bushing arrangement according to claim 4, wherein said electrically conductive material is at least substantially made up of several pieces of electrically conductive tape.

6. The bushing arrangement according to claim 4, wherein said electrically conductive material is made up of several electrically conductive sleeves.

7. The bushing arrangement according to claim 6, including several fire resistant sleeves extending parallel to said cable and at least partially filling remaining space in said wall opening.

8. The bushing arrangement according to claim 7, wherein said at least one cable is passed through one of said fire resistant sleeves.

9. The bushing arrangement according to claim 7, including a heat resistant and liquid repellant putty for sealing at least one open side of said wall opening.

10. The bushing arrangement according to claim 4, wherein said electrically conductive material is made of an electrically conductive rubber.

11. The bushing arrangement according to claim 10, wherein said rubber has been made electrically conductive through the addition thereto of carbon particles.

12. The bushing arrangement according to claim 11, wherein said carbon particles are concave, shell-shaped particles.

13. The bushing arrangement according to claim 11, wherein said carbon particles are of the type "Ketjenblack EC" 300J or 600 JD™.

14. The bushing arrangement according to claim 10, wherein said rubber is EPDM rubber.

15. The bushing arrangement according to claim 1, wherein said electrically conductive tape has a contact width of about 40 mm.

16. A method for passing an electrical cable having electrically conductive shielding through an opening in a wall while providing protection against propagation of electromagnetic overtension and electrical interference comprising the steps of:

placing an electrically conductive bushing in said opening that is electrically connected to earth ground potential; and using an electrically conductive tape to connect said electrically conductive shielding to said electrically conductive bushing so as to connect said conductive shielding to earth ground potential.

17. An apparatus for preventing electrical and electromagnetic flow through a partition along electrically conductive shielding around an electrically conductive cable passing through the partition, said apparatus comprising in combination:

a partition having an opening;

an electrical cable having a conductor and electrically conductive shielding passing through said opening; and an electrically conductive tape wrapped around said electrically conductive shielding of said cable for grounding electrically conductive shielding using said partition.

* * * * *